United States Patent [19]
Jinbo

[11] Patent Number: 6,163,171
[45] Date of Patent: Dec. 19, 2000

[54] PULL-UP AND PULL-DOWN CIRCUIT

[75] Inventor: Toshikatsu Jinbo, Tokyo, Japan

[73] Assignee: NEC Corporation, Tokyo, Japan

[21] Appl. No.: 09/012,398

[22] Filed: Jan. 23, 1998

[30] Foreign Application Priority Data

Jan. 24, 1997 [JP] Japan ................................ 9-011074

[51] Int. Cl.$^7$ ................. H03K 19/0175; H03K 19/094
[52] U.S. Cl. ................. 326/83; 328/83; 328/86; 328/112; 328/119; 328/121; 327/310; 327/313
[58] Field of Search ................. 326/9, 21, 83, 326/86, 112, 119, 121; 327/310, 313, 327, 328, 391, 437, 543

[56] References Cited

U.S. PATENT DOCUMENTS

| | | | |
|---|---|---|---|
| 4,707,625 | 11/1987 | Yanagisawa | 327/437 |
| 5,198,699 | 3/1993 | Hashitomo et al. | 307/270 |
| 5,777,509 | 7/1998 | Gasparik | 327/543 |
| 5,874,836 | 2/1999 | Nowak et al. | 326/83 |

FOREIGN PATENT DOCUMENTS

| | | |
|---|---|---|
| 56-118352 | 9/1981 | Japan . |
| 750771 | 5/1995 | Japan . |
| 8103070 | 4/1996 | Japan . |

OTHER PUBLICATIONS

Sedra et al. Microelectronic Circuits & Devices. Prentice Hall. p. 343, 1987.

*Primary Examiner*—Michael Tokar
*Assistant Examiner*—Vibol Tan

[57] ABSTRACT

To provide a pull-up circuit and a pull-down circuit having the same withstand voltage performance to other neighboring circuit elements without needing special layout consideration, a pull-up circuit of the invention having an nMOS pull-up transistor (N1) connected between a first node (A2) and a pull-up node (OU) comprises a pMOS transistor (P2), a drain of said pMOS transistor (P2) connected to the first node (A2), a source and a substrate of said pMOS transistor (P2) connected to a positive power supply (Vcc), and a gate of said pMOS transistor (P2) controlled with a pull-up signal; and a pull-down circuit of the invention having a pMOS transistor (P1) connected between a first node (B2) and a pull-down node (OD) comprises an nMOS transistor (N2), a drain of said nMOS transistor (N2) connected to the first node (B2), a source and a substrate of said nMOS transistor (N2) connected to a negative power supply (GND), and a gate of said nMOS transistor (N2) controlled with a pull-down signal.

10 Claims, 16 Drawing Sheets

203, 204, 207, 208, 209 : METALLIC WIRING FILM

PULL-UP AND PULL-DOWN CIRCUIT

BACKGROUND OF THE INVENTION

The present invention relates to a pull-up and a pull-down circuit, and particularly to those to be used for maintaining potential of certain nodes of an inner circuit of a semiconductor device at either of positive or negative power supply voltage level.

There are semiconductor devices whereof inner circuits are provided with pull-up or pull-down circuits for maintaining potential of certain nodes therein at positive or negative power supply voltage level. To a conventional pull-up circuit used in these semiconductor devices, a diode-connected nMOS (n-channel type Metal Oxide Semiconductor) transistor is applied, whereof gate being coupled with an end of current pass (drain or source, which is hereafter represented by drain), drain is connected to a positive power supply and source is connected to the node to be pulled up, while a diode connected pMOS (p-channel type MOS) transistor is applied to a conventional pull-down circuit, whereof source is connected to the node to be pulled down, drain coupled with its gate being connected to a negative power supply.

FIGS. 11A and 11B illustrate the above conventional pull-up and pull down circuit. The pull-up circuit of FIG. 11A comprises an nMOS transistor N1, whereof a gate is coupled with a drain and connected to a positive power supply Vcc, a source is connected to a pull-up node OU, and a substrate is connected to a ground GND.

Denoting threshold voltage counting the back-bias effect of the nMOS transistor N1 by Vtn, the maximum voltage of the pull-up node OU is expressed as Vcc—Vtn (Vcc being power supply voltage). Therefore, the pull-up node OU cannot be pulled up until to the power supply voltage Vcc. When the threshold voltage Vtn=1V and the power supply voltage Vcc=5V, the maximum voltage becomes (5−1)=4V, for example. Hence, the pull-up circuit of FIG. 11A is mainly used where the pull-up node needs lower voltage than the power supply voltage Vcc, or it cannot be connected but to an nMOS transistor.

Similarly, the pull-down circuit of FIG. 11B comprises a pMOS transistor P1, whereof a gate is coupled with a drain and connected to the ground GND, a source is connected to a pull-down node OD, and a substrate is biased by the positive power supply voltage Vcc.

Here also, the minimum voltage of the pull-down node OD is given by GND—Vtp (GND and Vtp being ground voltage and threshold voltage counting the back-bias effect of the pMOS transistor P1, respectively). Therefore, the pull-down node OD cannot be pulled down until to the ground voltage GND. When the threshold voltage Vtp=−1V and the ground voltage GND=0V, the minimum voltage becomes (0−(−1))=1V, for example. Hence, the pull-down circuit of FIG. 11B is mainly used where the pull-down node needs higher voltage than the ground voltage GND, or it cannot be connected but to a pMOS transistor.

Now, some examples of usage of these pull-up and pull-down circuits are described, in the following paragraphs.

FIG. 12 is a circuit diagram of a semiconductor circuit disclosed in a Japanese Patent published with a specification No. 50771/'95, comprising an input buffer 1 connected an input pad T1, an output buffer 3 connected to an output pad T2, and an inner logic circuit 2 connected between them. The input buffer 1 and the output buffer 3 are driven directly with a common power supply voltage Vcc for interfacing with outer circuits. On the other hand, the inner logic circuit 2 is driven with lower voltage supplied to a pull-up node OU from the positive power supply Vcc through pull-up circuits 4 having voltage regulation nMOS transistors N1. By lowering the driving voltage thus intentionally, application of short-channel high-speed transistors can be enabled in the inner logic circuit 2, with lower power consumption, as well.

FIGS. 13A and 13B are circuit diagrams illustrating charge-pump circuits disclosed in a Japanese patent application laid open as a Provisional Publication No. 103070/'96, wherein a pull-up circuit having an nMOS transistor N1 is used for supplying a first stage voltage to a first node NA1 of the charge-pump circuit of FIG. 13A for outputting a positive high voltage to an output terminal Vpcp, and similarly, a pull-down circuit having a pMOS transistor P1 is used for supplying a first stage voltage to a first node NB1 of the charge-pump circuit of FIG. 13B for outputting a negative high voltage to an output terminal Vncp.

The above pull-up and pull-down circuit operate normally when the power supply voltage Vcc or GND is well regulated. However, they have a problem that they may be easily broken when surges are impressed to the power supply voltage Vcc or GND, caused by static electricity, for example, resulting in failure of the semiconductor devices, as will be described in the following paragraphs.

FIG. 14A is a cross section schematically illustrating an example of a semiconductor configuration of the pull-up circuit of FIG. 11A having the nMOS transistor N1, wherein a gate electrode 104 is provided on an insulation film traversing n-type diffusion layers 102 and 103 configured on a p-type semiconductor substrate 100.

The n-type diffusion layers 102 and 103 compose the nMOS transistor N1 of the pull-up circuit (hereafter called the pull-up transistor) together with the gate electrode 104. The n-type diffusion layer 102 and the gate electrode 104 is connected to the positive power supply Vcc and another n-type diffusion layer 103 is connected to the pull-up node OU. Further, a p-type diffusion layer 105 is configured neighboring on the pull-up transistor N1 for supplying biasing voltage to the p-type semiconductor substrate 100. Elements of the pull-up transistor are separated from the p-type diffusion layer 105 with a field insulation film 101.

FIG. 14B is a cross section schematically illustrating another example of the semiconductor configuration comprising the pull-up circuit of FIG. 11A, wherein another nMOS transistor is composed of n-type diffusion layers 106 and 107 and a gate electrode 108 in place of the p-type diffusion layer 105 of FIG. 14A, neighboring the pull-up transistor N1 composed of the n-type diffusion layers 102 and 103 and the gate electrode 104. The pull-up transistor N1 and the other nMOS transistor are separated with the field insulation film 101 and the n-type diffusion layer 107 (source electrode of the other nMOS transistor) is connected to the ground GND.

FIG. 15 is a graphic chart illustrating voltage-current characteristics of current flowing from the n-type diffusion layer 102 to the ground GND through the p-type diffusion layer 105 of FIG. 14A or the n-type diffusion layer 107 of FIG. 14B, when a surge voltage higher than withstand voltage V1 is impressed to the n-type diffusion layer 102.

In the semiconductor configuration of FIG. 14A, a surge current Is represented by a curve L1 to L2 (passing a point AM) of FIG. 15 flows from the n-type diffusion layer 102 to the p-type diffusion layer 105 through the p-type semiconductor substrate 100, when a high voltage Vs higher than the withstand voltage V1 is impressed there because of a surge voltage V4 impressed to the positive power supply Vcc.

The n-type diffusion layer 102 being connected to the positive power supply Vcc through a low resistance metallic film, in general, the high voltage Vs at the n-type diffusion layer 102 drops little as represented by a curve L4 of FIG. 15, even when the surge current Is flows. Hence, the surge current Is increases up to a cross point (V3, I1) of the curves L2 and L4 as illustrated in FIG. 15. Thus, the n-type diffusion layer 102 is broken because of either of a high temperature caused by the surge current value I1 or an electric field caused by the high voltage of V3, when one of them is too high.

In case of the semiconductor configuration of FIG. 14B, the surge current Is flows following the curve L1 in the same way with the case of FIG. 14A, when the high-voltage Vs higher than the withstand voltage V1 is impressed. The surge current Is flows injecting positive holes into the p-type semiconductor substrate 100, and potential of the p-type semiconductor substrate 100 is made higher. Therefore, when the surge current Is arrives to I2 at the point AM of FIG. 15, for example, the p-n junction between the neighboring n-type diffusion layer 107, which is grounded, and the p-type semiconductor substrate 100 becomes forward biased and electrons begin to be injected from the n-type diffusion layer 107 for the n-type diffusion layer 102, giving a negative resistance characteristic between them, as represented by a curve L3 beginning from the point AM of FIG. 15.

Therefore, the n-type diffusion layer 102 may be broken in the case of the semiconductor configuration of FIG. 14B because of the high temperature caused by the intense surge current Is following the curve L3 triggered by lower surge voltage V2.

These breakdowns of the pull-up transistor N1 come mainly from the fact that the positive power supply Vcc is directly connected by the low resistance metallic film to the n-type diffusion layer 102 configured on the p-type semiconductor substrate 100 which is, however, biased to the ground voltage GND commonly with other circuit elements.

For preventing these breakdowns of the n-type diffusion layer, various considerations are paid until now for designing element layout of the pull-up transistor to be configured on a semiconductor device, in order to improve withstand voltage thereof by lightening electric field intensity or reserving necessary distance for reducing the surge current intensity.

FIG. 16 is a schematic diagram illustrating an example of element layout of a conventional pull-up transistor comprising a gate electrode 202 and an n-type diffusion layer 201, drain side thereof being coupled by contact points (one of them being denoted by a numeral 205) with a metallic wiring film 204 supplied with the power supply voltage Vcc and source side thereof coupled by contact points with another metallic wiring film 203 connecting to the output node OU.

In general, the breakdown of the n-type diffusion layer because of high voltage begins at an edge part thereof or a part thereof connecting to the gate edge. Therefore, distance D1 from the contact point (205, for example) to the edge of the n-type diffusion layer 201 and that D2 to the edge of the gate electrode 202 are made longer for the pull-up transistor, expecting current suppression by the diffusion layer resistance, compared to corresponding distances D11 and D12 of other ordinary transistors, composed of a gate electrode 211 and an n-type diffusion layer 210, for example, in the prior art of FIG. 16.

As for also the gate electrode 202, a long wiring path is provided between a channel part and a contact point supplied with the positive power supply Vcc of the gate electrode 202, expecting a long time constant given by resistance and capacitance thereof to prevent a high-peak trigger which may cause an insulation film breakdown between the gate electrode 202 and the substrate or the source side of the n-type diffusion layer 201.

Furthermore, for preventing the intense surge current because of the negative resistance as described in connection with FIG. 14B, a p-type diffusion layer 206 connected to the ground GND is provided in the element layout of FIG. 16 for separating the pull-up transistor and the n-type diffusion layer 210, for example, of other ordinary nMOS transistors connected to the ground GND, so that the n-type diffusion layer 210 may not be forward biased to the substrate potential thereabout made high.

In addition, distances between the pull-up transistor and the p-type diffusion layer 206 and the n-type diffusion layer 210 are made longer than ordinary layout arrangement in order to increase withstand voltage of the pull-up transistor, in the element layout of FIG. 16.

These are representative examples of layout consideration for improving withstand voltage of the pull-up transistor.

However, these layout techniques need a larger space of the semiconductor chips inevitably, resulting in low productivity and high production cost thereof.

Further, the element layout, or the size arrangement, is very difficult because it must be designed considering various factors such as growth methods of diffusion layers or resistance values of substrate materials. So, the withstand voltage performance of semiconductor devices cannot be estimated in many cases until they are tested after fabrication, and the element layout should be re-designed again when it is found to be insufficient.

Heretofore, problems of the pull-up transistor are described. However, the pull-down transistor has the same problems except for polarity difference, wherein the p-type diffusion layer is broken when a negative high voltage is impressed to the p-type diffusion layer connected directly to the ground GND relative to the substrate potential of the pMOS pull-down transistor biased to the positive power supply voltage Vcc.

SUMMARY OF THE INVENTION

Therefore, a primary object of the present invention is to provide a pull-up circuit and a pull-down circuit having the same withstand voltage performance to other neighboring circuit elements without needing any special layout consideration.

In order to achieve the object, a pull-up circuit of the invention, having an nMOS transistor, gate-drain connection thereof connected to a first node supplied from a positive terminal of a power supply, a source thereof connected to a pull-up node and a substrate thereof connected a negative terminal of the power supply, comprises a pMOS transistor, a drain of said pMOS transistor connected to the first node, source and a substrate of said pMOS transistor connected to the positive terminal, and a gate of said pMOS transistor controlled with a pull-up signal; and a pull-down circuit of the invention, having a pMOS transistor, gate-drain connection thereof connected to a first node supplied from a negative terminal of a power supply, a source thereof connected to a pull-down node and a substrate thereof connected a positive terminal of the power supply, comprises an nMOS transistor, a drain of said nMOS transistor connected to the first node, a source and a substrate of said nMOS transistor connected to the negative terminal, and a gate of said nMOS transistor controlled with a pull-down signal.

Therefore, even when a surge is impressed to the positive or the negative terminal of the power supply, over current can be prevented, each of the serially connected nMOS transistor and pMOS transistor working as load element of each other similarly to an ordinary CMOS circuit, without any special layout of the semiconductor chip.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1A:
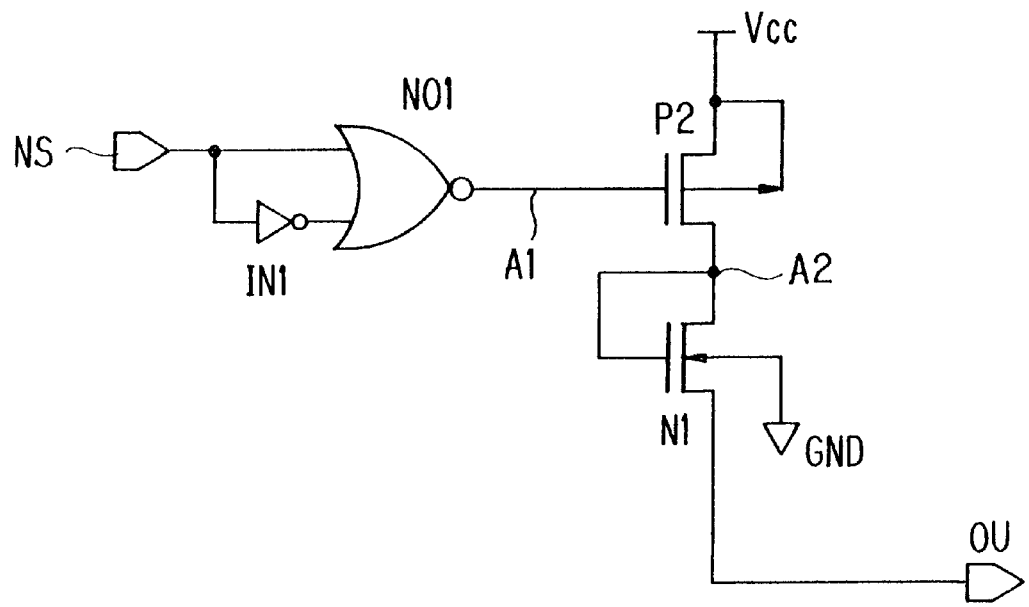
FIGS. 1A and 1B are circuit diagrams illustrating a pull-up circuit and a pull-down circuit according to a first embodiment of the invention.
Figure 1B:
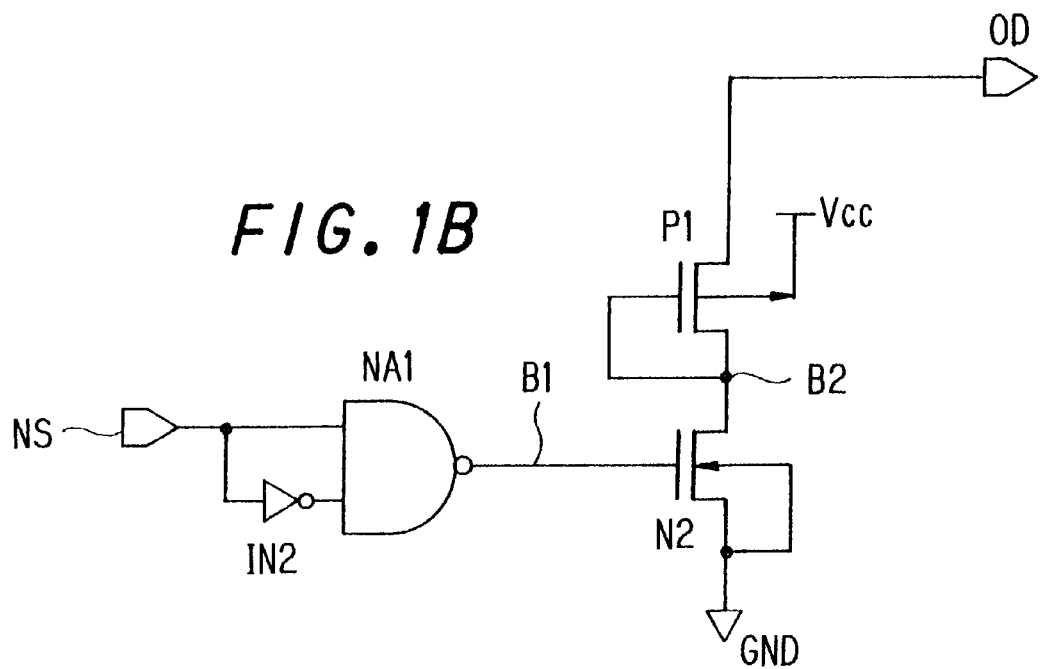

FIGS. 1A and 1B are circuit diagrams illustrating a pull-up circuit and a pull-down circuit according to a first embodiment of the invention.

Figure 11A:
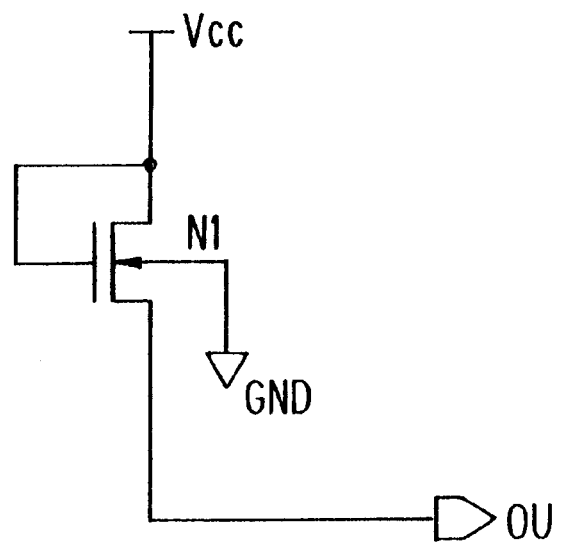
FIGS. 11A and 11B illustrate conventional pull-up and pull down circuits.

The pull-up circuit of FIG. 1A comprises;

an inverter IN1 for obtaining inverse logic of a control signal NS, a two input NOR gate NO1 for obtaining NOR logic A1 of the control signal NS and output of the inverter IN1, and a pMOS transistor P2 whereof a gate is controlled by output of the two input NOR gate NO1, a source and a substrate are connected to a positive power supply Vcc, and a drain connected to a node A2, in addition to an nMOS transistor N1, whereof a gate is coupled with an end of current pass (a drain, for example) and connected to the node A2, that is, to the drain of the pMOS transistor P2, a source is connected to a pull-up node OU, and a substrate is connected to a ground GND, similarly to the nMOS transistor N1 of FIG. 11A.

Figure 11B:
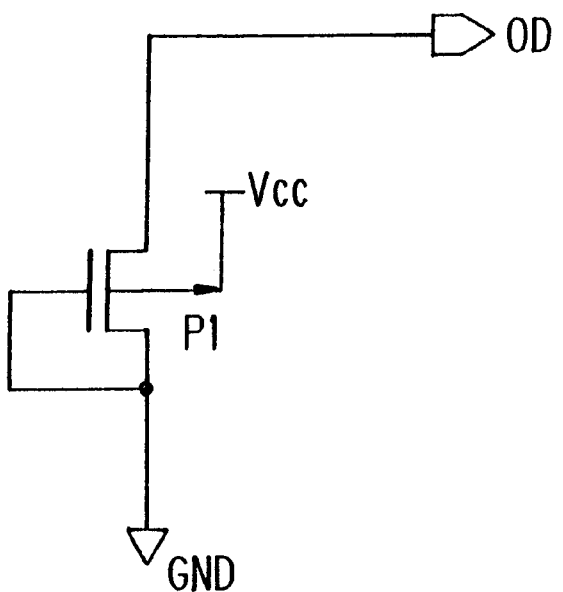

Similarly, the pull-down circuit of FIG. 1B comprises;

an inverter IN2 for obtaining inverse logic of a control signal NS, a two input NAND gate NA1 for obtaining NAND logic B1 of the control signal NS and output of the inverter IN2, and an nMOS transistor N2 whereof a gate is controlled by output of the two input NAND gate NA1, a source and a substrate are connected to a ground GND, and a drain connected to a node B2, in addition to a pMOS transistor P1, whereof a gate is coupled with an end of current pass (a drain, for example) and connected to the node B2, that is, to the drain of the nMOS transistor N2, a source is connected to a pull-down node OD, and a substrate is connected to a positive power supply Vcc, similarly to the pMOS transistor P1 of FIG. 11B.

The pull-up circuit of FIG. 1A normally operates as follows.

The two input NOR gate NO1 outputs the NOR logic A1 of the control signal NS and its inverted signal, which remains at LOW level always independent of logic of the control signal NS. Therefore, the pMOS transistor P2 always remains at status ON, supplying the positive power supply voltage Vcc to the node A2, and the nMOS transistor N1 pulls up the pull-up node OU to the same voltage with the node A2. Hence, the same pull-up level Vcc—Vtn is obtained with the conventional pull-up circuit of FIG. 11A, that is, (5−1)=4V, when the positive power supply voltage Vcc=5V and the threshold voltage Vtn=1V together with the back-bias effect.

In the same way, the two input NAND gate NA1 of FIG. 1B outputs the NAND logic B1 of the control signal NS and its inverted signal, which remains always at HIGH level independent of logic of the control signal NS. Therefore, the nMOS transistor N2 always remains at status ON, maintaining the node B2 at the ground voltage GND, and the pMOS transistor P1 pulls down the pull-down node OD to the same voltage with the node B2. Hence, the same pull-down level GND—Vtp is obtained with the conventional pull-down circuit of FIG. 11B, that is, (0−(−1))=1V, when the ground voltage GND=0V and the threshold voltage Vtp=−1V together with the bacl-bias effect, when the pull-down circuit operates normally.

Figure 2:
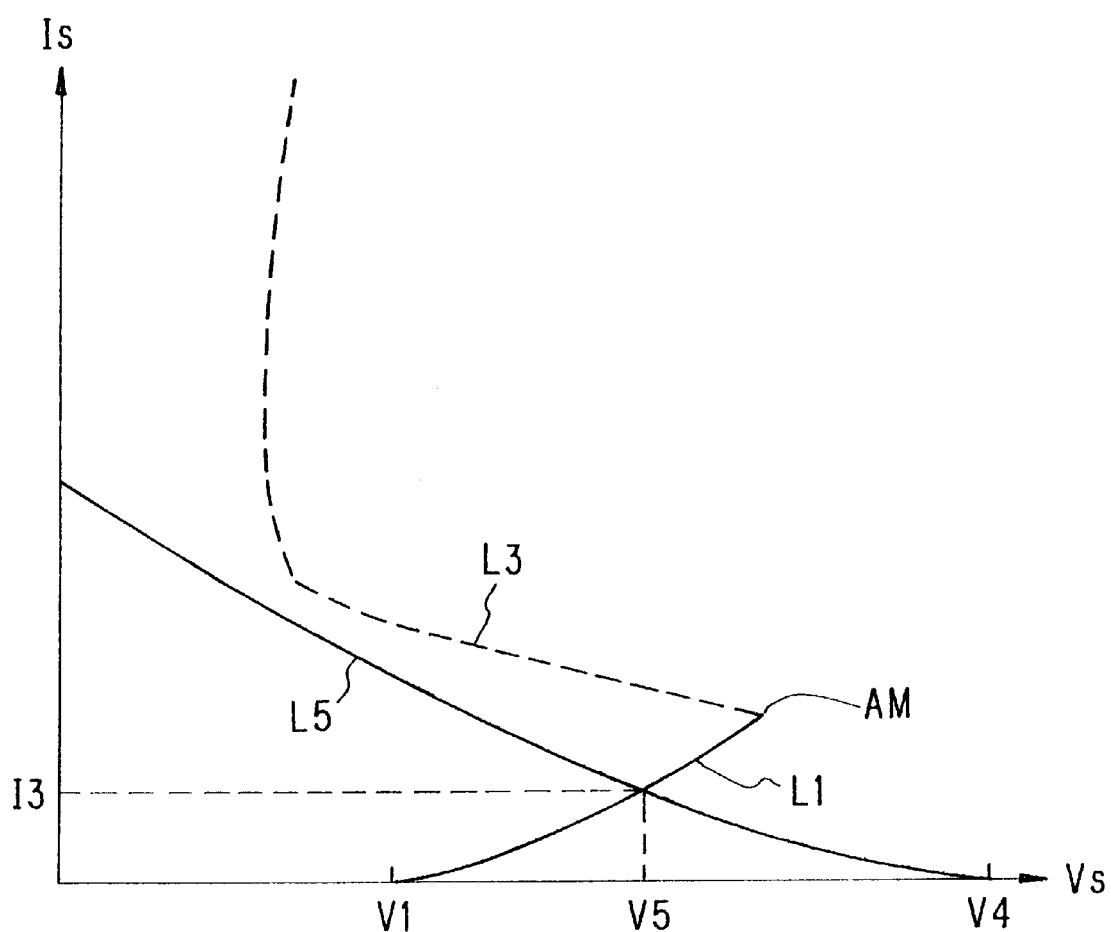
FIG. 2 is a graphic chart illustrating voltage-current characteristics of current flowing through the gate-drain connection of the pull-up transistor N1 of FIG. 1A.

FIG. 2 is a graphic chart illustrating voltage-current characteristics of current flowing through the gate-drain connection of the pull-up transistor N1 of FIG. 1A, for example, when a high voltage Vs higher than withstand voltage V1 is impressed thereto because of a surge voltage V4 of the positive power supply Vcc.

If there is not provided the pMOS transistor P2, the surge current Is should flow following the curve L1 making substrate potential high, the point AM where neighboring p-n junction becoming forward biased, and the curve L3 giving the negative resistance characteristic, resulting in an intense-current breakdown of the pull-up transistor. However, the pMOS transistor P2 is provided between the node A2 and the positive power supply Vcc, in the embodiment. Therefore, the high voltage Vs is decreased from the surge voltage V4 by the pMOS transistor P2 working as a load element as represented by a curve L5 of FIG. 2, when the surge current Is begins to flow. Hence, the surge current Is is limited within I3 given by cross point (V5, I3) of the curves L1 and L5, preventing the intense-current breakdown of the pull-up transistor N1.

The difference between the pull-up circuit of FIG. 1A according to the embodiment and the conventional pull-up circuit of FIG. 11A lies in that the surge current becomes intense in the conventional pull-up circuit because of very little load resistance of the gate-drain connection supplied directly by a metallic wiring film with the positive power supply voltage Vcc, which is supplied through the pMOS transistor P2 in the embodiment, the pMOS transistor P2 and the nMOS transistor N1 working as load resistance of each other.

The circuit configuration of FIG. 1A is equivalent with an ordinary CMOS circuit composed of a serial connection of a pMOS and an nMOS transistor provided between the positive power supply Vcc and the ground GND when the pull-up node OU is regarded to be grounded, with their gates connected neither of the positive power supply Vcc and the ground GND, giving the same withstand voltage performance as an ordinary CMOS circuit.

Figure 16:
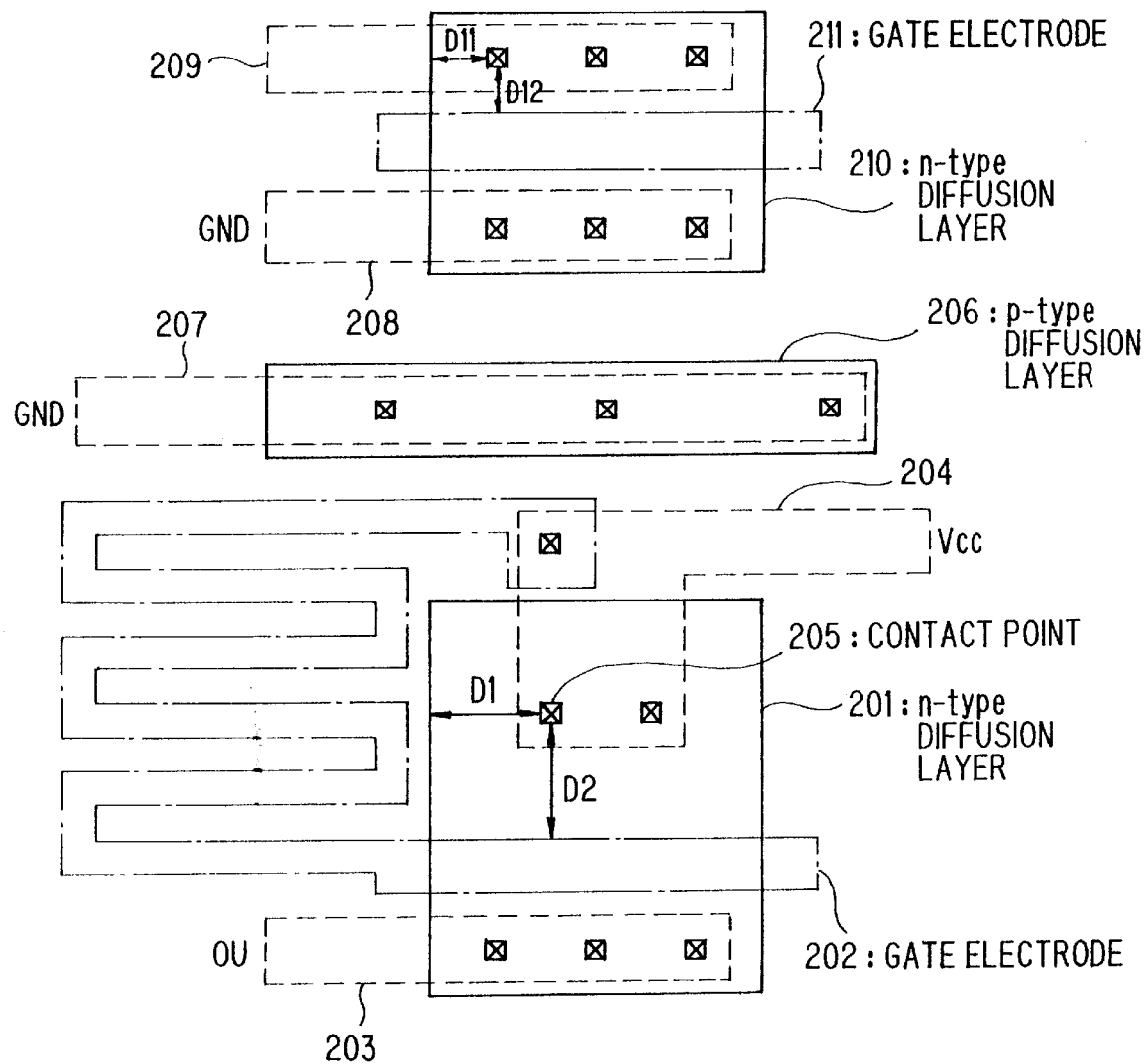
FIG. 16 is a schematic diagram illustrating an example of element layout of a conventional pull-up transistor.

Therefore, no special layout consideration as beforehand described referring to FIG. 16 becomes necessary in the embodiment for maintaining the withstand voltage performance of the pull-up circuit to be the same with that of other circuits.

This is the same with the pull-down circuit of FIG. 1B, wherein the pull-down transistor P1 and the nMOS transistor N2 work as load elements of each other, giving the same withstand voltage performance as other neighboring circuit without any special layout consideration.

Some circuit examples, wherein are applied the pull-up and the pull-down circuit of the embodiment, are described in the following paragraphs.

Figure 3:
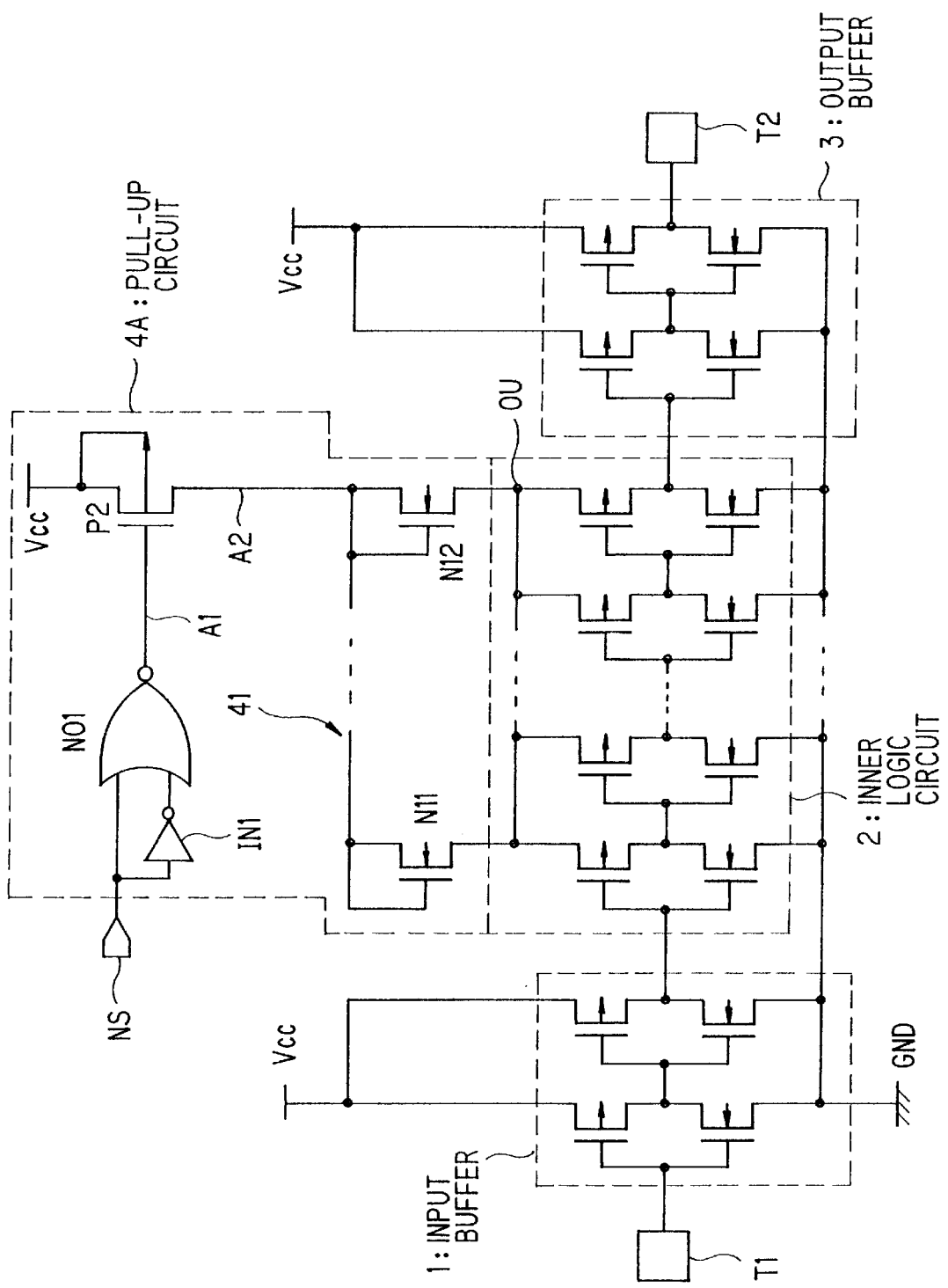
FIG. 3 is a circuit diagram illustrating a semiconductor circuit wherein the pull-up circuit of FIG. 1A is applied.
Figure 12:
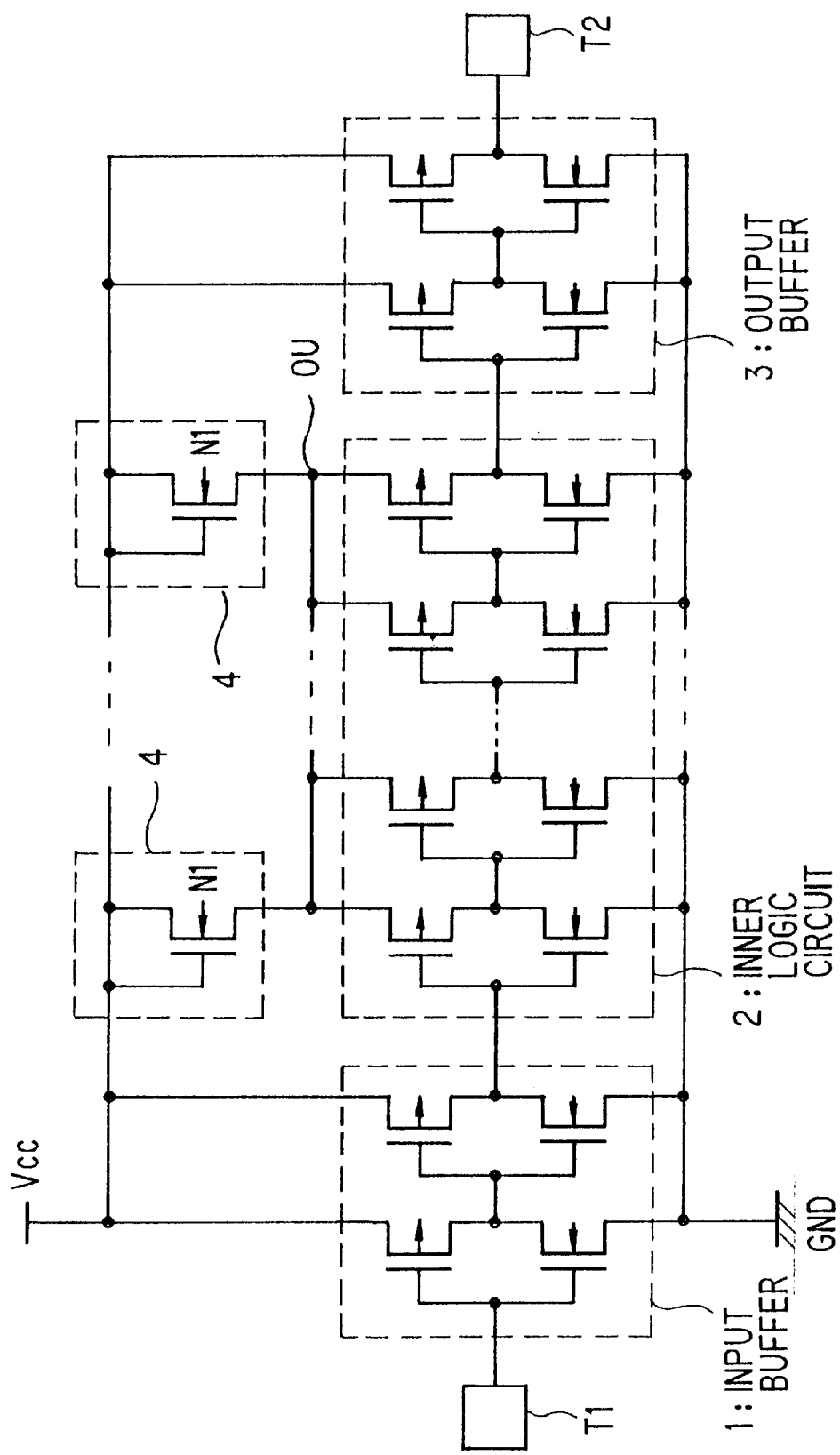
FIG. 12 is a circuit diagram of a semiconductor circuit disclosed in a Japanese Patent published with a specification No. 50771/'95.

FIG. 3 is a circuit diagram illustrating a semiconductor circuit corresponding to that of FIG. 12, wherein the pull-up circuit of FIG. 1A is applied. The semiconductor circuit of FIG. 3 is provided with a pull-up circuit 4A in place of the pull-up circuits 4 of FIG. 12.

The pull-up circuit 4A comprises;
a parallel connection 41 of nMOS transistors N11 to N12, each thereof having a source connected to a pull-up node OU, a gate and a drain diode connected and a substrate biased to a ground voltage GND,
a pMOS transistor P2 with its source and substrate connected to a positive power supply Vcc and its drain connected to a node A2 whereto are connected gate-drain connections of the parallel connection 41 of nMOS transistors N11 to N12, and
an inverter IN1 for obtaining inverse logic of a control signal NS input through an input terminal, and
a two input NOR gate NO1 for obtaining NOR logic A1 of the control signal NS and output of the inverter IN1.

The two input NOR gate NO1 of FIG. 3 outputs NOR logic A1 of the control signal NS and its inverted signal always remaining at LOW level independent of logic of the control signal NS, and the pMOS transistor P2 remains always at status ON, in the same way with those of FIG. 1A, supplying the positive power supply voltage Vcc to the node A2. Therefore, the pull-up node OU is supplied with a voltage lowered by the parallel connection 41 of nMOS transistors N11 to N12 from the positive power supply voltage Vcc of the node A2 by their threshold voltage with the back bias effect, enabling application of short-channel high-speed and low consumption transistors in the inner logic circuit 2, in the same way with the semiconductor circuit of FIG. 12.

The withstand voltage performance of the pull-up circuit 4A, when a surge voltage is impressed to the positive power supply Vcc, can be designed to be the same with the other circuits, the input buffer 1, the inner logic circuit 2 and the output buffer 3, without any special layout, as described in connection with FIG. 2.

Figures 4A, 4B:
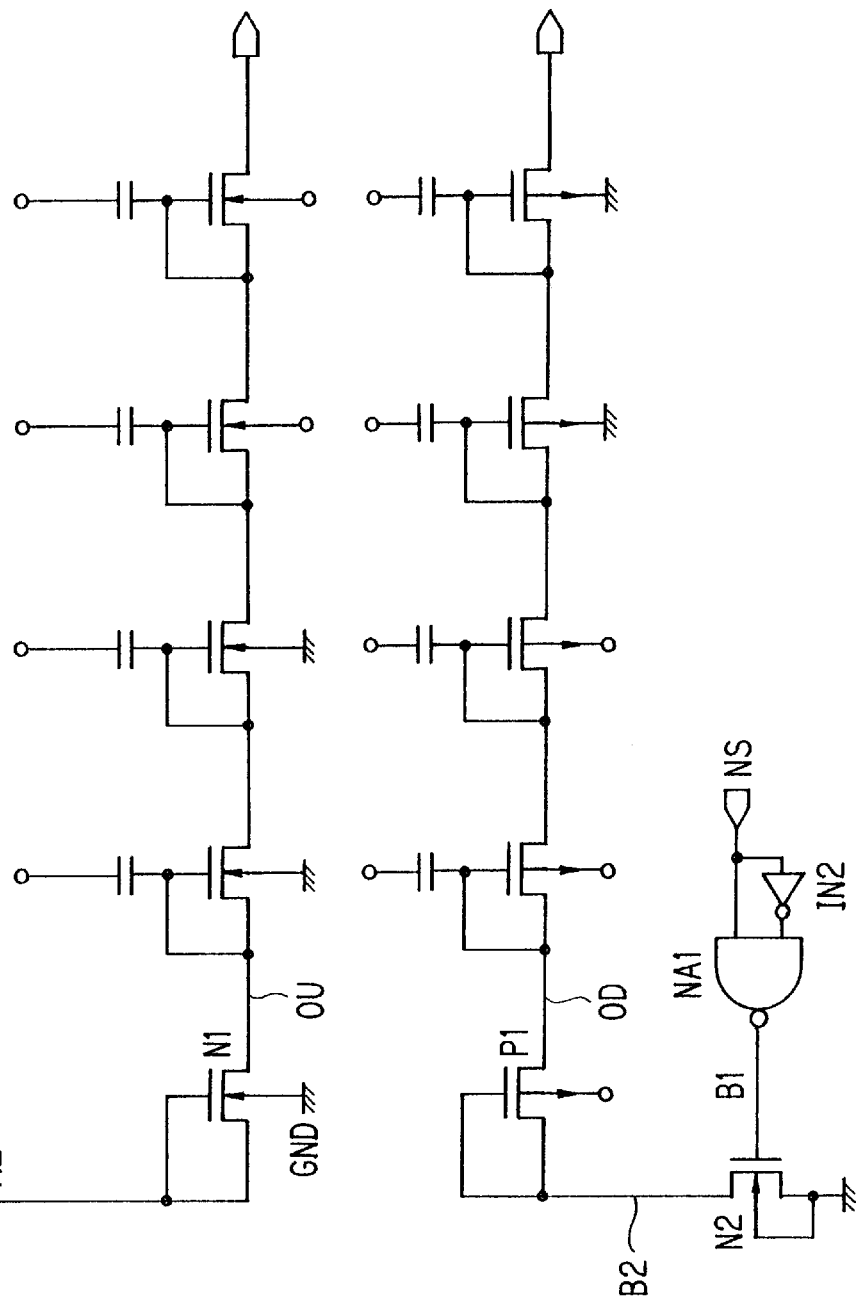
FIGS. 4A and 4B are circuit diagrams illustrating charge-pump circuits wherein the pull-up and the pull-down circuit of FIGS. 1A and 1B are applied.
Figure 13A:
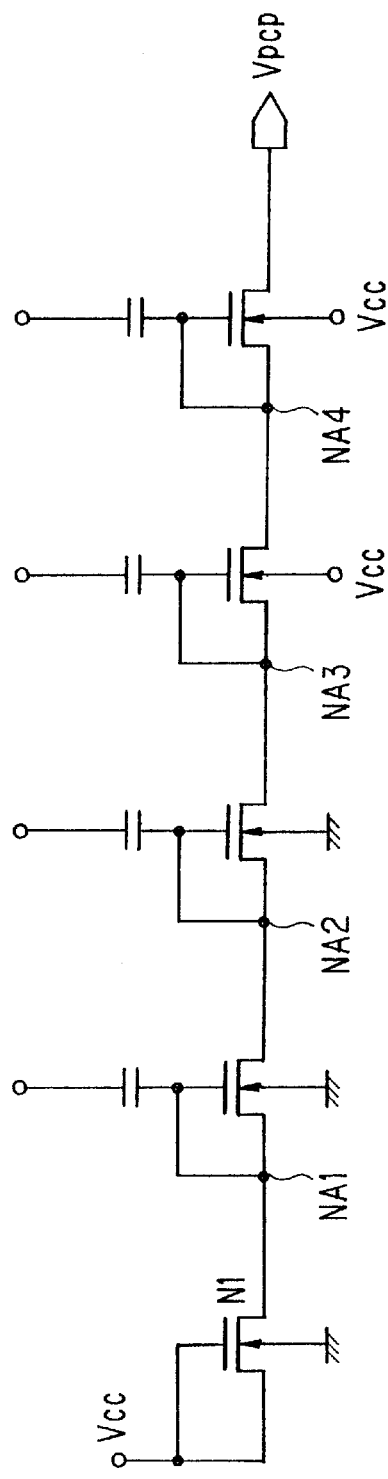
FIGS. 13A and 13B are circuit diagrams illustrating charge-pump circuits disclosed in a Japanese patent application laid open as a Provisional Publication No. 103070/'96.
Figure 13B:
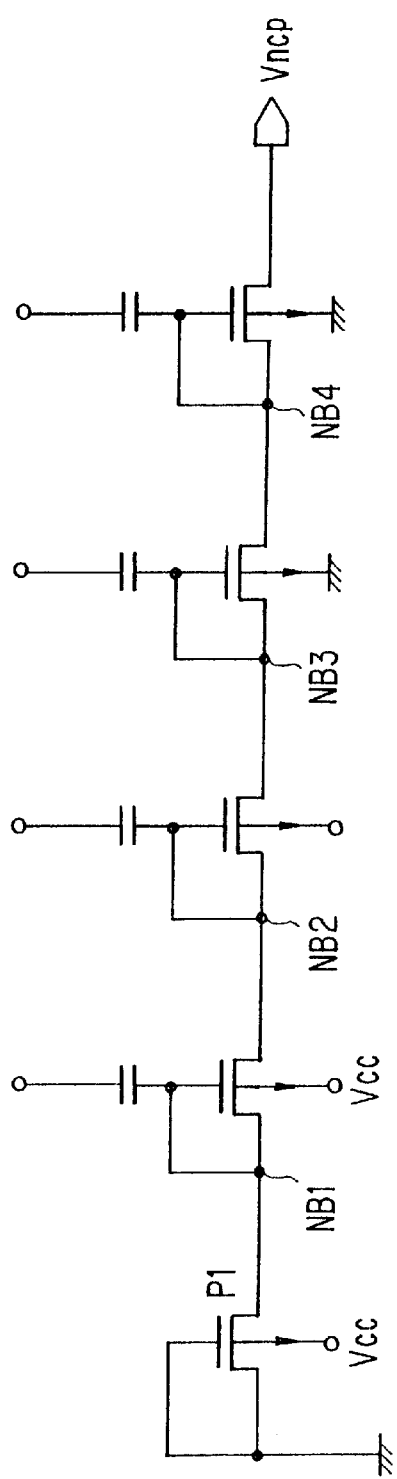
Figure 14A:
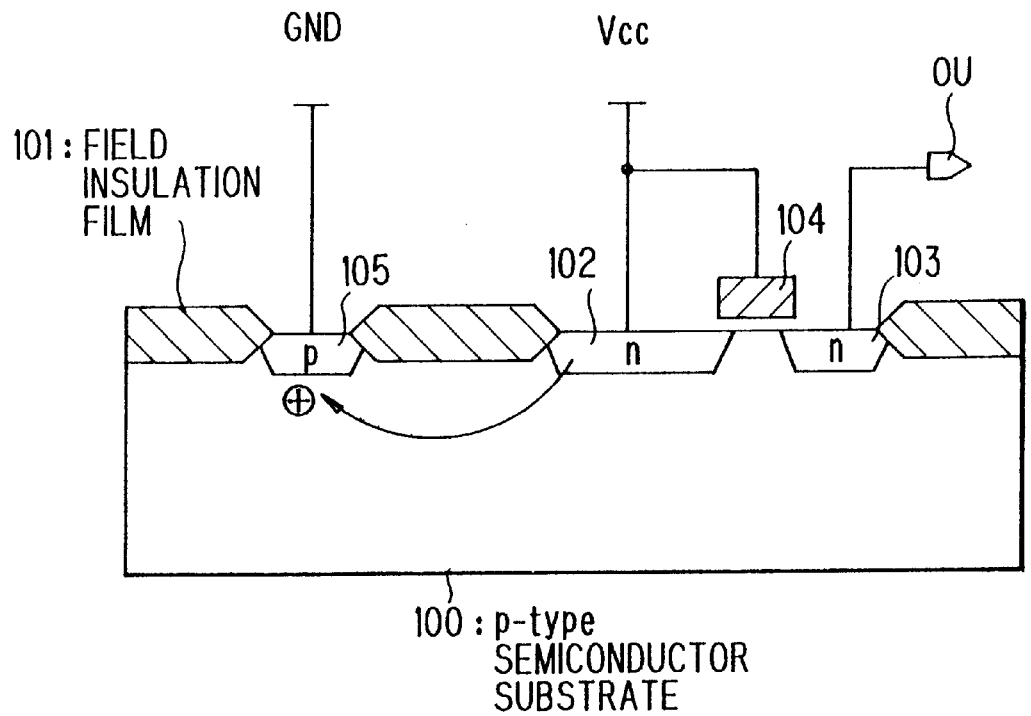
FIG. 14A is a cross section schematically illustrating an example of a semiconductor configuration of the pull-up circuit of FIG. 11A.
Figure 14B:
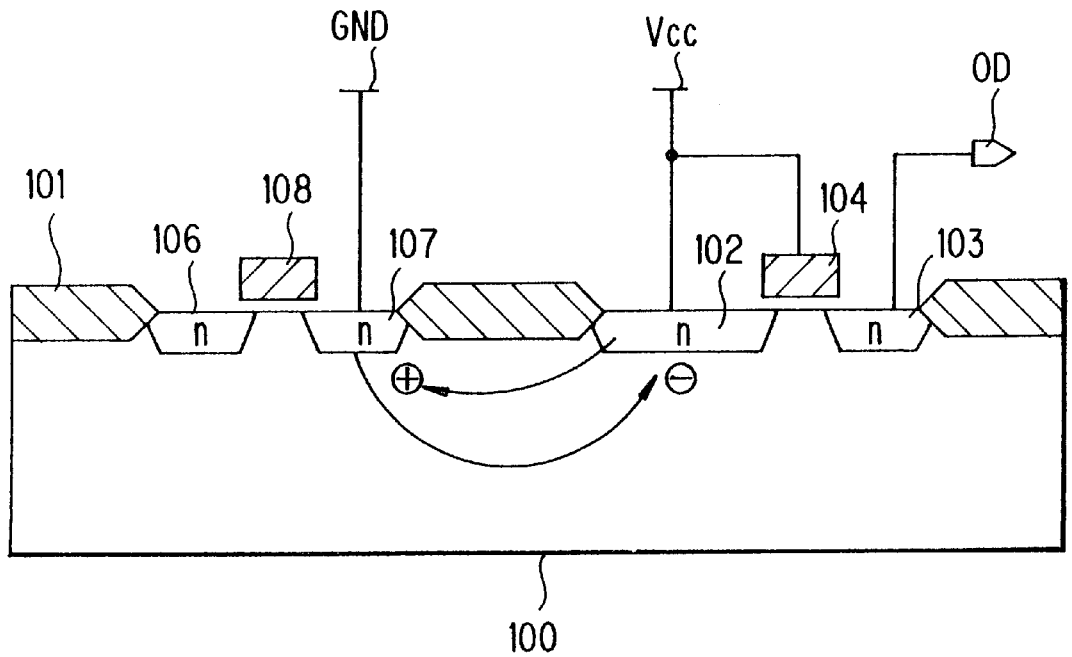
FIG. 14B is a cross section schematically illustrating another example of the semiconductor configuration comprising the pull-up circuit of FIG. 11A.
Figure 15:
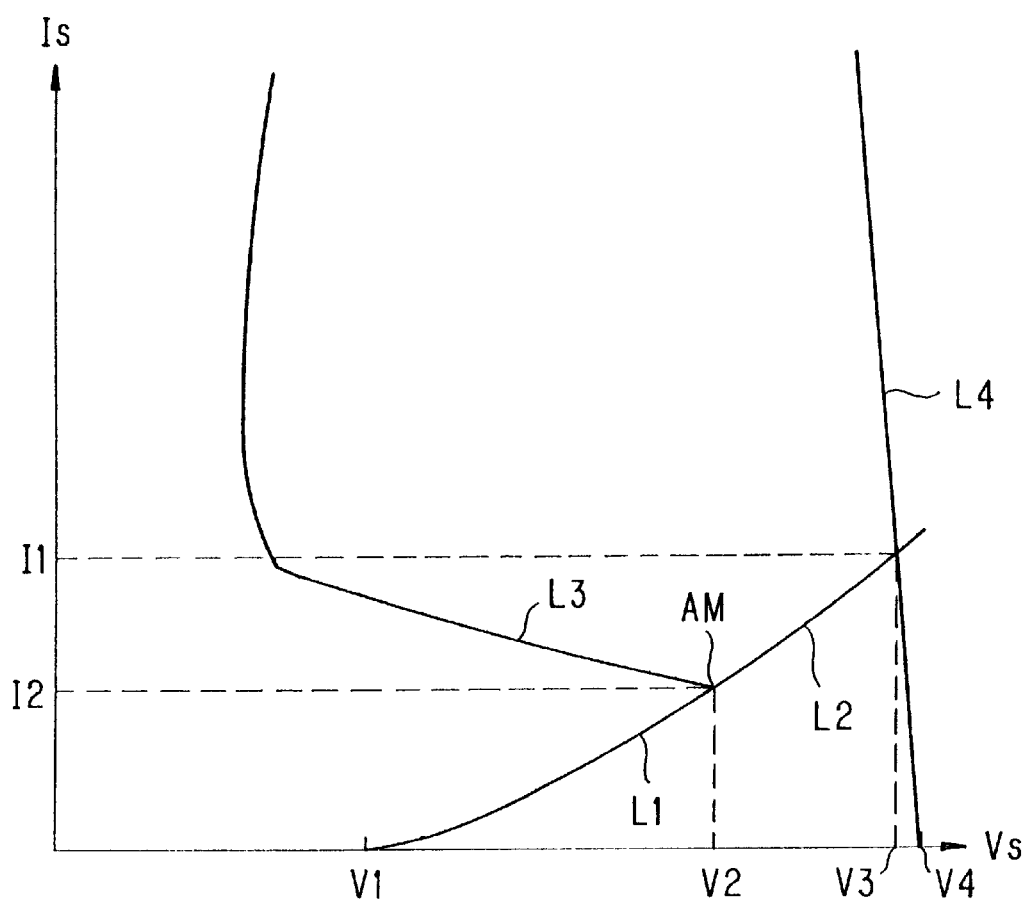
FIG. 15 is a graphic chart illustrating voltage-current characteristics of current flowing from the n-type diffusion layer 102 to the ground GND through the p-type diffusion layer 105 of FIG. 14A or the n-type diffusion layer 107 of FIG. 14B, when a surge voltage higher than withstand voltage V1 is impressed to the n-type diffusion layer 102.

FIGS. 4A and 4B are circuit diagrams illustrating charge-pump circuits corresponding to those of FIGS. 13A and 13B. The charge-pump circuit of FIG. 4A comprises a pMOS transistor P2 with its source and substrate connected to a positive power supply Vcc and its drain connected to a node A2, an inverter IN1 for obtaining inverse logic of a control signal NS input through an input terminal, and a two input NOR gate NO1 for obtaining NOR logic A1 of the control signal NS and output of the inverter IN1 for controlling gate of the pMOS transistor P2, in addition to an nMOS transistor N1 with its gate-drain connection connected to the node A2 for supplying a first stage voltage to a first node OU of the charge-pump as a pull-up circuit, while the charge pump circuit of FIG. 4B comprises an inverter IN2 for obtaining inverse logic of a control signal NS input through an input terminal, a two input NAND gate NA1 for obtaining NAND logic B1 of the control signal NS and output of the inverter IN2, and an nMOS transistor N2 whereof a gate is controlled by output of the two input NAND gate NA1, a source and a substrate are connected to a ground GND, and a drain connected to a node B2, in addition to a pMOS transistor P1 used for supplying a first stage voltage to a first node OD of the charge-pump as a pull-down circuit.

In the charge pump circuits of FIGS. 4A and 4B, the pull-up and the pull down circuit have equivalent withstand voltage performance with peripheral circuits of the charge pump circuit, in the same way in the semiconductor circuit of FIG. 3.

Thus, a pull-up circuit and a pull-down circuit having the same withstand voltage performance to other neighboring circuit elements are obtained according to the embodiment without needing any special layout consideration.

Figure 5A:
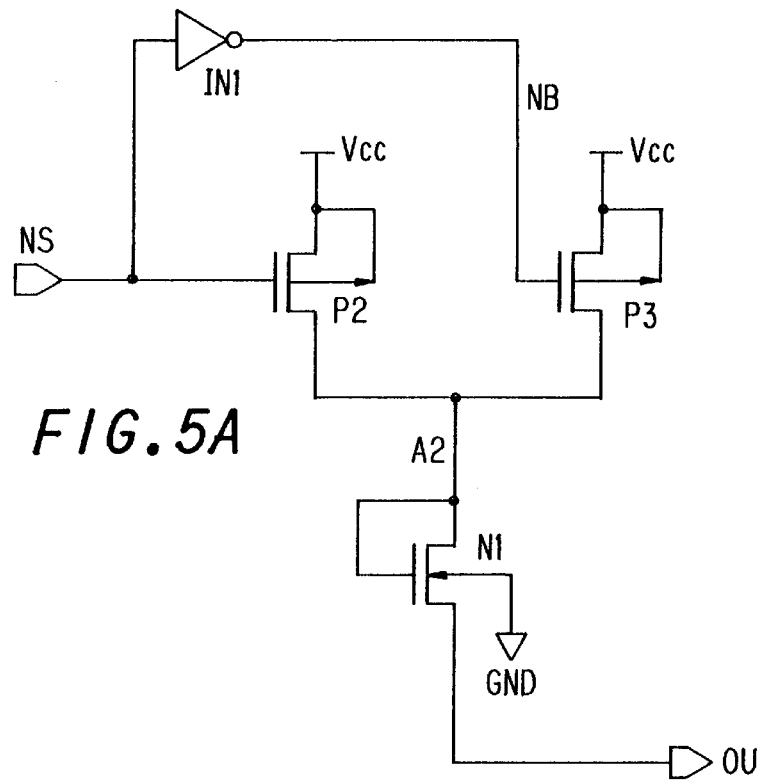
FIGS. 5A and 5B are circuit diagrams illustrating a pull-up circuit and a pull-down circuit according to a second embodiment of the invention.

Now, a pull-up and a pull-down circuit according to a second embodiment of the invention will be described referring to circuit diagrams of FIGS. 5A and 5B. FIG. 5A illustrates the pull-up circuit of the second embodiment, wherein is provided a pMOS transistor P3 in place of the two input NOR gate NO1 of the pull-up circuit of FIG. 1A.

Source and substrate of the pMOS transistor P3 are connected to the positive power supply Vcc, drain thereof is connected to the node A2 and gate thereof is controlled by inverted logic NB of the control signal NS input through the input terminal and inverted by the inverter IN1, while the gate of the pMOS transistor P2 is connected directly to the input terminal, in the embodiment of FIG. 5A.

Figure 5B:
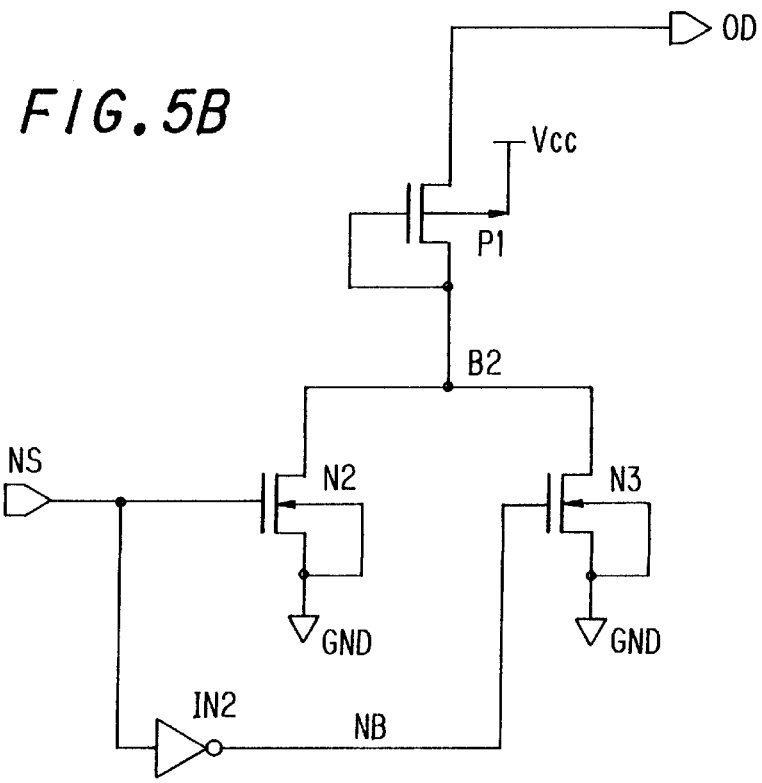

Similarly, the pull-down circuit of the second embodiment illustrated in FIG. 5B comprises an nMOS transistor N3 in place of the two input NAND gate NA1 of the pull-down circuit of FIG. 1B, whereof source and substrate are connected to the ground GND, drain is connected to the node B2 and gate is controlled by inverted logic NB of the control signal NS input through the input terminal and inverted by the inverter IN2, the gate of the nMOS transistor N2 being connected directly to the input terminal.

In the pull-up circuit of FIG. 5A, when the control signal is at LOW level, the pMOS transistor P2 becomes ON and the pMOS transistor P3 becomes on when the control signal is at HIGH level, the positive power supply voltage Vcc being supplied to the node A2 in both case, that is, independent of logic of the control signal. Hence, the pull-up circuit of FIG. 5A operates in the same way with the embodiment of FIG. 1A, even when a surge voltage is impressed there. Similarly, the pull-down circuit of FIG. 5B operates in the same way with the embodiment of FIG. 1B.

In the second embodiment of FIGS. 5A and 5B, the two input NOR gate NO1 or the two input NAND gate NA1 is not necessary. Therefore, chip space of the semiconductor devices can be more economized than the first embodiment of FIGS. 1A and 1B, when the pMOS transistor P3 or the nMOS transistor N3 occupies smaller space than the two input NOR gate NO1 or the two input NAND gate NA1. This is the merit of the second embodiment.

Figure 6A:
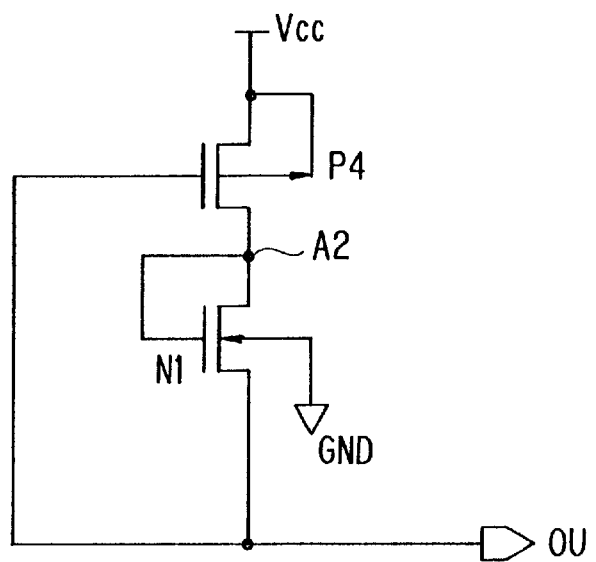
FIGS. 6A and 6B are circuit diagrams illustrating a pull-up and a pull-down circuit according to a third embodiment of the invention.
Figure 6B:
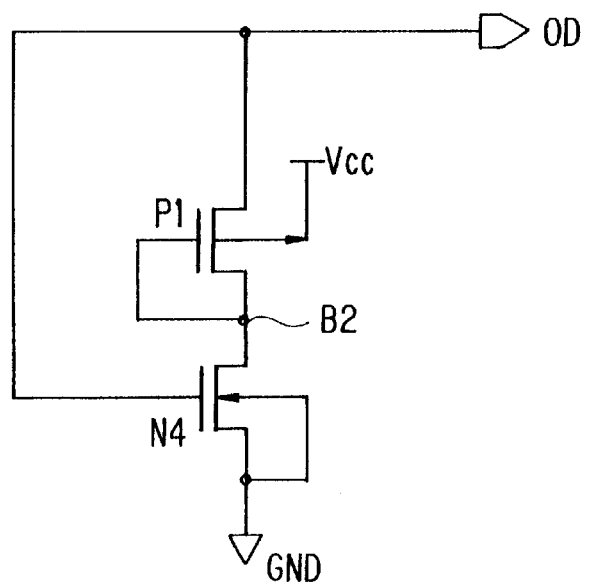

FIGS. 6A and 6B are circuit diagrams illustrating a pull-up and a pull-down circuit according to a third embodiment of the invention. In the pull-up circuit of FIG. 6A, there is comprised a pMOS transistor P4 in place of the pMOS transistor P2, the two input NOR gate NO1 and the inverter IN1 of the pull-up circuit of FIG. 1A, whereof source and substrate are connected to the positive power supply Vcc, drain is connected to the node A2 and gate is connected to the pull-up node OU, while the pull-down circuit of FIG. 6B comprises an nMOS transistor N4 in place of the the nMOS transistor N2, the two input NAND gate NA1 and the inverter IN2 of the pull-down circuit of FIG. 1B, whereof source and substrate are connected to the ground GND, drain is connected to the node B2 and gate is connected to the pull-down node OD.

As for the withstand voltages of the third embodiment, they are equivalent to those of the first and the second embodiment. However, the pull-up voltage or the pull-down voltage is a little different to those of the first and the second embodiment, affected by threshold voltage taking in account the back-bias effect of the pMOS transistor P4 or the nMOS transistor N4.

Figure 7A:
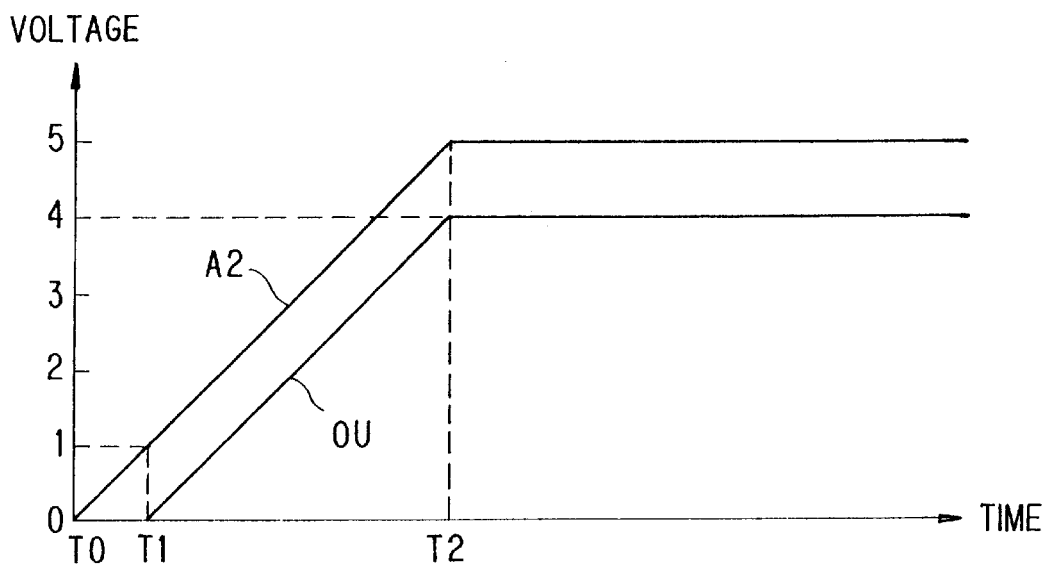
FIGS. 7A and 7B are graphic charts illustrating rising up of the pull-up voltage of the pull-up circuit of FIG. 6A.
Figure 7B:
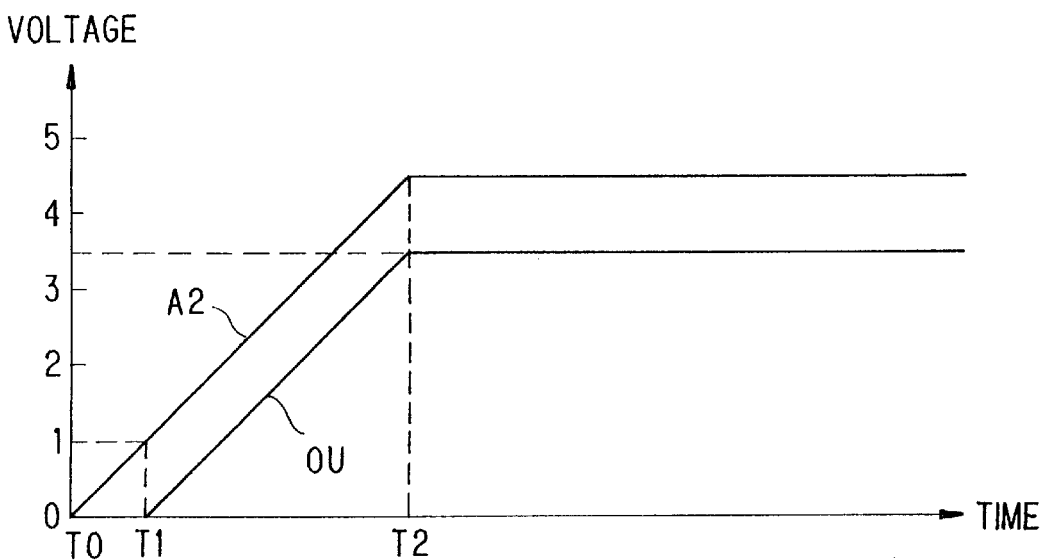

FIGS. 7A and 7B are graphic charts illustrating rising up of the pull-up voltage of the pull-up circuit of FIG. 6A. The threshold voltage Vtp of the pMOS transistor P4 does not vary according to the back-bias effect because its source and substrate are both connected to the positive power supply Vcc, while the threshold voltage Vtn of the nMOS transistor N1 varies because its substrate is grounded and its source is connected to the pull-up node OU, voltage thereof rising up. However, they are both assumed here to be constant for convenience of explanation.

FIG. 7A shows rising up of the pull-up voltage when $|Vtp| \leq Vtn$, $Vtp=-1V$ and $Vtn=1V$, by way of example.

At a timing T0 in an initial state where potential of both the node A2 and the pull-up node is 0V, the positive power supply voltage Vcc is supplied.

Gate and drain being at 0V and source being at 5V, the pMOS transistor P4 is ON and the node A2 is pulled up. At a timing T1, where potential of the node A2 becomes over Vtn=1V, the nMOS transistor N1 turns to ON and the pull-up node OU begins to be pulled up. The pMOS transistor P4 remains to be ON until the pull-up node OU attains to Vcc+Vpt=5−1=4V, supplying the positive power supply voltage Vcc=5V to the node A2. The nMOS transistor N1 having the threshold voltage Vtn=1V, also remains to be ON until the pull-up node OU attains to 5−1=4V, when the node A2 is supplied with the positive power supply voltage Vcc=5V. Thus, finally at a timing T2, the pull-up node OU is pulled up to 4V, the same pull-up voltage with the first or the second embodiment.

On the other hand, the pull-up voltage rises up as illustrated in FIG. 7B, when $|Vtp|>Vtn$, $Vtp=-1.5V$ and $Vtn=1V$, for example.

In the same way with FIG. 7A, the node A2 begins to be pulled up at the timing T0 where the positive power supply voltage Vcc is supplied when potential of both the node A2 and the pull-up node OU is 0V. When potential of the node A2 becomes over Vtn=1V at the timing T1, the nMOS transistor N1 turns to ON and the pull-up node OU begins to be pulled up.

The pMOS transistor P4 turns to OFF, in this case, when the pull-up node OU attains to Vcc+Vtp=5−1.5=3.5V. The nMOS transistor N1, having the threshold voltage Vtn=1V, may remain to be ON until the pull-up node OU attains to 5−1=4V, when the node A2 continues to be supplied with the positive power supply voltage Vcc=5V. However, at the timing T2, the pMOS transistor P4 turns to OFF when the pull-up node OU is pulled up to 3.5V. Thus, the pull-up voltage becomes lower than the first or the second embodiment, in the third embodiment when $|Vtp|>Vtn$.

However, it is rare that $|Vtp|>Vtn$ because the back-bias effect is larger in the nMOS transistor N1 having its substrate grounded.

Similarly, the pull-down voltage of the pull-down circuit of FIG. 6B becomes a little different than that of FIG. 1B or FIG. 5B.

Figure 8A:
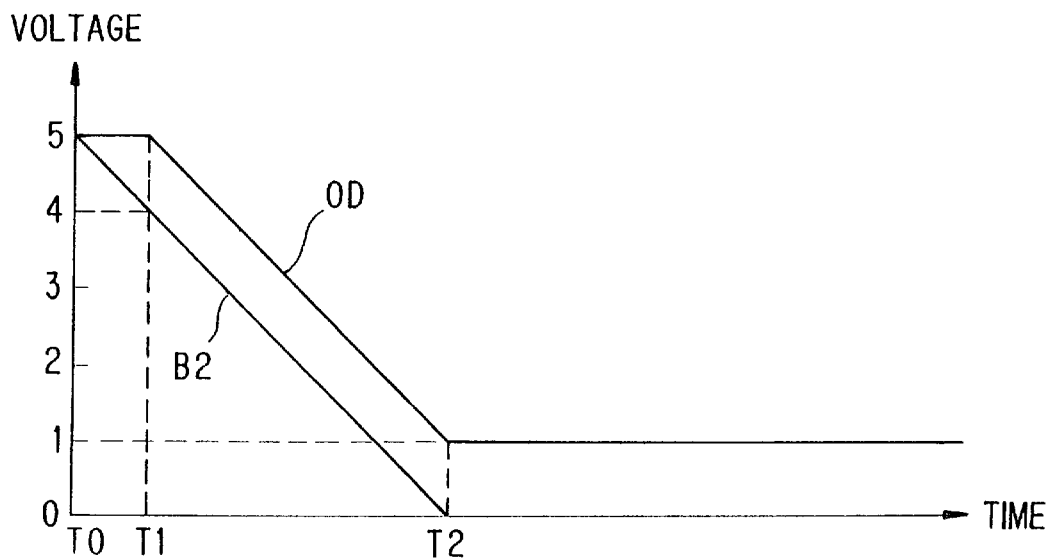
FIGS. 8A and 8B are graphic charts illustrating falling down of the pull-down voltage of the pull-down circuit of FIG. 6B.
Figure 8B:
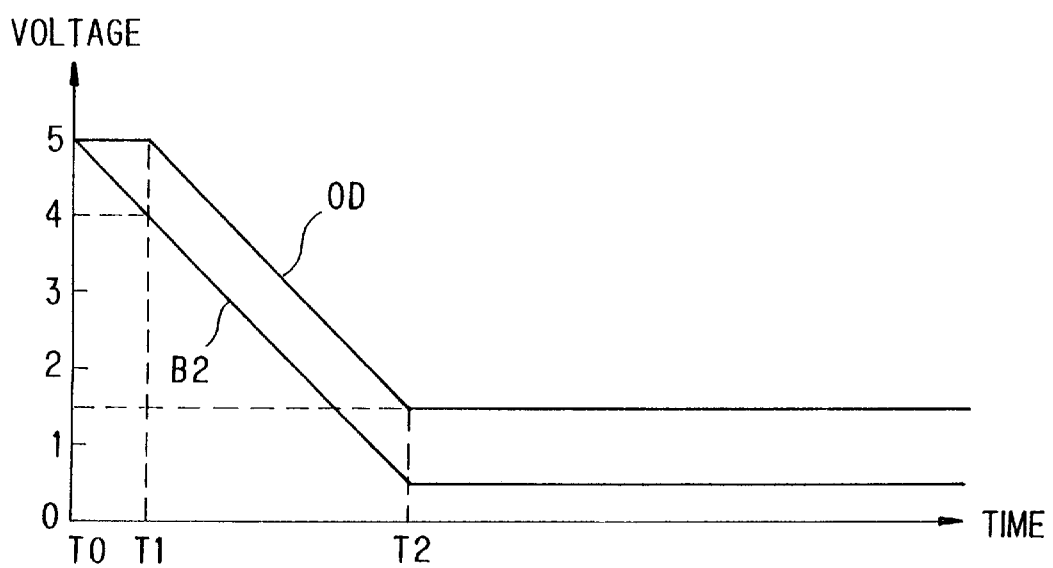

FIGS. 8A and 8B are graphic charts illustrating falling down of the pull-down voltage of the pull-down circuit of FIG. 6B. Here also, threshold voltages Vtp and Vtn of the pMOS transistor P1 and the nMOS transistor N4 are assumed to be constant for convenience of explanation.

FIG. 8A shows rising up of the pull-up voltage when $|Vtp| \geq Vtn$, $Vtp=-1V$ and $Vtn=1V$, by way of example.

At the timing T0 where potential of both the node B2 and the pull-up node is 5V, source of the nMOS transistor N4 is grounded.

Gate and drain being at 5V and source being at 0V, the nMOS transistor N4 is ON and the node B2 is pulled down. At a timing T1, where potential of the node B2 becomes under 4V, the pMOS transistor P1 turns to ON and the pull-down node OD begins to be pulled down. The nMOS transistor N4 remains to be ON until the pull-down node OD is pulled down until Vtn=1V. The pMOS transistor P1, having the threshold voltage Vtp=−1V, also remains to be ON until the pull-down node OD is pulled down to 1V, when the node B2 is at 0V. Thus, at the timing T2, the pull-down node OD is pulled down to 1V, the same pull-down voltage with the first or the second embodiment.

On the other hand, the pull-down voltage falls down as illustrated in FIG. 8B, when |Vtp|<Vtn, Vtp=−1V and Vtn=1.5V, for example.

In the same way with FIG. 8A, the node B2 begins to be pulled down at the timing T0 where source of the nMOS transistor N4 is grounded when potential of both the node B2 and the pull-down node OD is 5V. When potential of the node B2 becomes under 4V at the timing T1, the pMOS transistor P1 turns to ON and the pull-down node OD begins to be pulled down.

The nMOS transistor N4 turns to OFF when the pull-down node OD is pulled down to Vtn=1.5V. The pMOS transistor P1, having the threshold voltage Vtp=−1V, may remain to be ON until the pull-down node OD is pulled down to 1V, when the node B2 continues to be grounded through the nMOS transistor N4. However, at the timing T2, the nMOS transistor N4 turns to OFF when the pull-down node OD is pulled down to 1.5V. Thus, the pull-down voltage becomes higher than the first or the second embodiment, in the third embodiment when |Vtp|<Vtn.

However, as above described, it is rare that |Vtp|<Vtn because the back-bias effect is larger in the pMOS transistor P1 having its substrate biased to the positive power supply voltage Vcc.

The pull-up circuit of FIG. 6A and the pull-down circuit of FIG. 6B according to the third embodiment have a demerit that they are a little inferior concerning current supplying ability because voltage difference between gate and source of the pMOS transistor P4 or the nMOS transistor N4 is reduced when the pull-up node OU is pulled up or the pull down node OD is pulled down. However, they need not inverters IN1 or IN2 and the two input NOR gate NO1 or the two input NAND gate NA1 of the first embodiment, enabling to simplify the circuit configuration and to reduce the semiconductor chip size. This is the merit of the third embodiment.

Figure 9A:
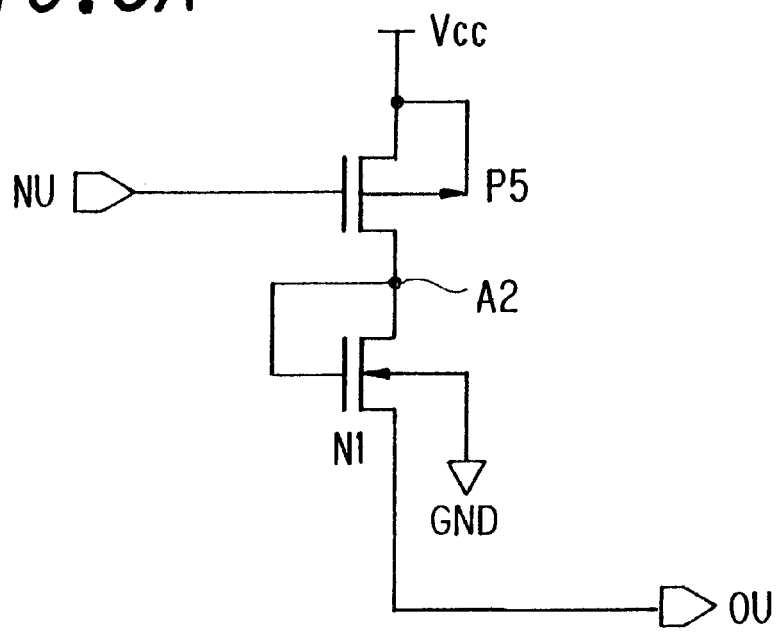
FIGS. 9A and 9B are circuit diagrams illustrating a pull-up circuit and a pull-down circuit according to a fourth embodiment of the invention.
Figure 9B:
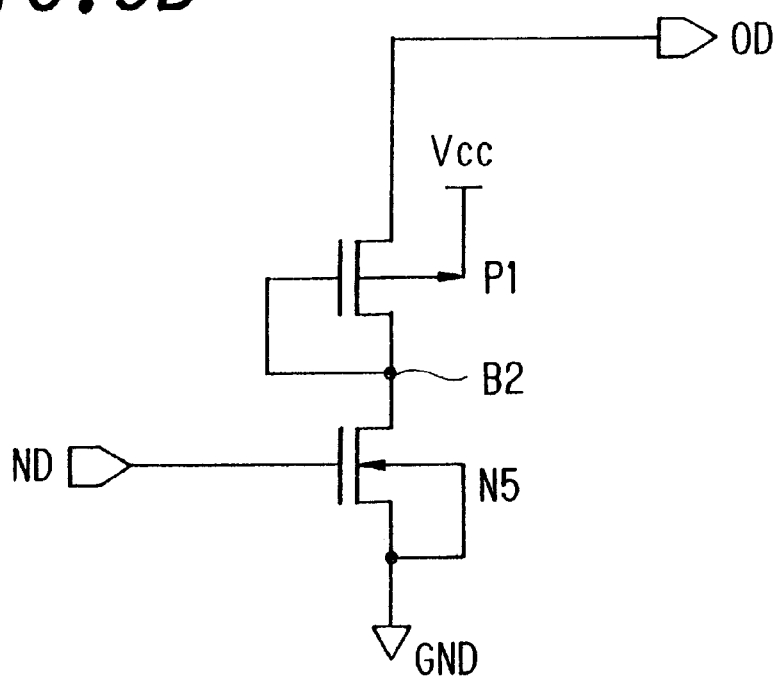

Now, a pull-up and a pull-down circuit according to a fourth embodiment are described referring to circuit diagrams of FIGS. 9A and 9B having similar configurations to those of FIGS. 6A and 6B.

The pull-up circuit of FIG. 9A comprises a pMOS transistor P5 with its source and substrate connected to the positive power supply Vcc, its drain connected to the node A2 and its gate controlled with a pull-up signal NU, in place of the pMOS transistor P4 of FIG. 6A, while the pull-down circuit of FIG. 9B comprising an nMOS transistor N5 with its source and substrate connected to the ground GND, its drain connected to the node B2 and its gate controlled with a pull-down signal ND, in place of the nMOS transistor N4 of FIG. 6B.

The pull-up signal NU becomes LOW level when the pull-up circuit is made active, and the pull-down signal ND becomes HIGH level when the pull-down circuit is made active.

The pull-up and the pull-down circuit of the fourth embodiment have the same merit with those of the third embodiment without the demerit concerning the current supplying ability, on condition that an appropriate pull-up signal NU or pull-down signal ND is available.

Figure 10A:
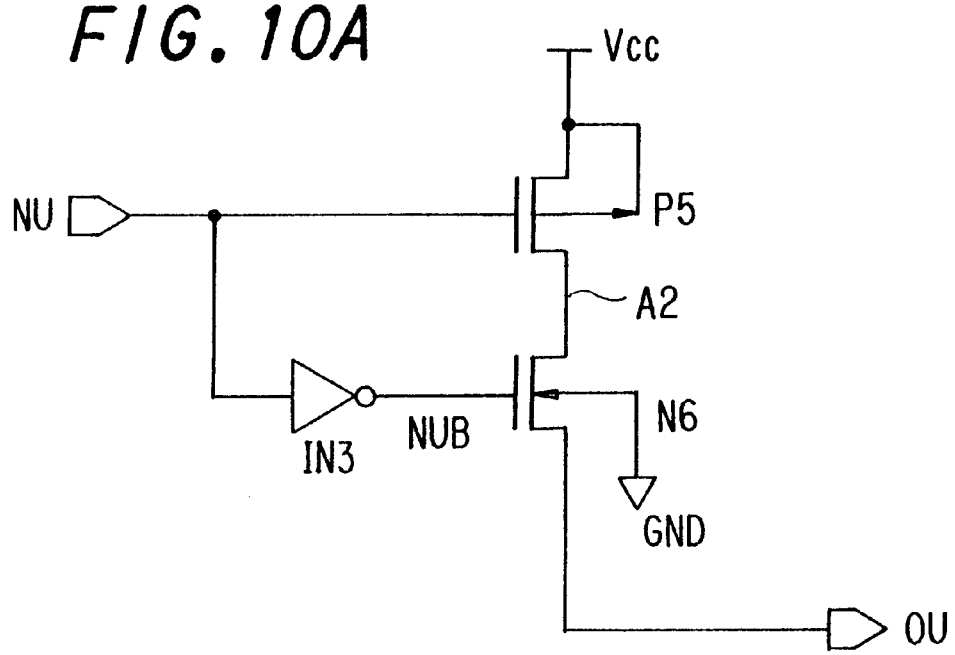
FIGS. 10A and 10B are circuit diagrams illustrating a pull-up and a pull-down circuit according to a fifth embodiment of the present invention.
Figure 10B:
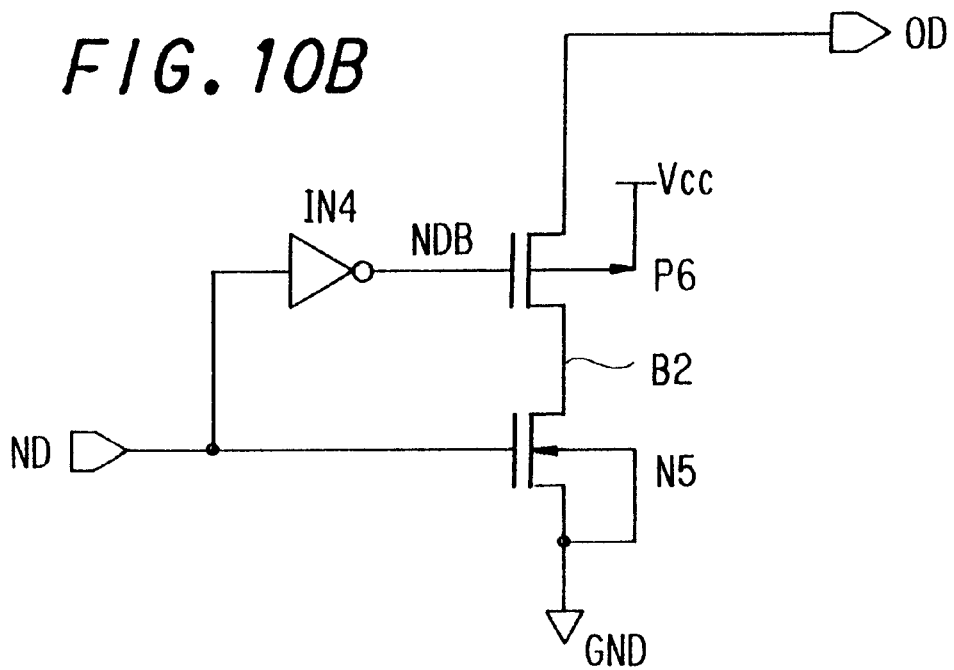

FIGS. 10A and 10B are circuit diagrams illustrating a pull-up and a pull-down circuit according to a fifth embodiment of the present invention.

Compared to the pull-up and pull-down circuit of FIGS. 9A and 9B, the pull-up circuit of FIG. 10A comprises an inverter IN3 for obtaining inverted logic of the pull-up signal NU, and an nMOS pull-up transistor N6 with its drain connected to the node A2, its source connected to the pull-up node OU, its substrate connected to the ground GND, and its gate controlled with output of the inverter IN3, in place of the nMOS pull-up transistor N1 of FIG. 9A, while the pull-down circuit of FIG. 10B comprises an inverter IN4 for obtaining inverted logic of the pull-down signal ND, and a pMOS pull-down transistor P6 with its drain connected to the node B2, its source connected to the pull-down node OD, its substrate connected to the positive power supply Vcc, and its gate controlled with output of the inverter IN4, in place of the pMOS pull-down transistor P1 of FIG. 9B.

The pull-up signal NU becomes LOW level making both the pMOS transistor P5 and the nMOS pull-up transistor N6 when the pull-up circuit is made active, and the pull-down signal ND becomes HIGH level making both the nMOS transistor N5 and the pMOS pull-down transistor P6 when the pull-down circuit is made active, in the same way with the fourth embodiment.

Thus, the pull-up and the pull-down circuit of the fifth embodiment operate in the same way with those of the fourth embodiment. Compared to the fourth embodiment, the pull-up and the pull-down circuit of the fifth embodiment need the inverter IN3 or IN4. However, gate of the nMOS pull-up transistor N6 or the pMOS pull-down transistor P6 is shifted to the positive power supply voltage Vcc or to the ground level GND when they are made active, while potential of gate-drain connection of the nMOS pull-up transistor N1 or the pMOS pull-down transistor P1 is a little lowered or raised because of on-resistance of the pMOS transistor P2 of FIG. 1A or the nMOS transistor N2 of FIG. 1B, for example. Therefore, the pull-up circuit and the pull-down circuit of the fifth embodiment have higher current supplying ability than those of the first to fourth embodiment.

As heretofore described, in the pull-up circuit of the invention, a pMOS transistor, which has a substrate connected to a positive power supply and is controlled to be ON when the pull-up circuit is made active, is provided between the positive power supply and gate-drain connection of an nMOS pull-up transistor, and in the pull-down circuit of the invention, an pMOS transistor, which has a substrate connected to a ground and is controlled to be ON when the pull-down circuit is made active, is provided between the ground and gate-drain connection of a pMOS pull-up transistor. Hence, even when a surge is impressed to the positive power supply or the ground, over current can be prevented, each of the serially connected nMOS transistor and pMOS transistor working as load element of each other similarly to an ordinary CMOS circuit, without any special layout of the semiconductor chip.

What is claimed is:

1. A pull-up circuit having an nMOS transistor, gate-drain connection thereof connected to a first node supplied from a positive terminal of a power supply, a source thereof connected to a pull-up node and a substrate thereof connected to a negative terminal of the power supply said pull-up circuit comprising:

a pMOS transistor, a drain of said pMOS transistor connected to the first node, a source and a substrate of said PMOS transistor connected to the positive terminal, and a gate of said pMOS transistor controlled with a pull-up signal;

an inverter for obtaining inverted logic of a control signal; and a two input NOR gate for outputting said pull-up signal having NOR logic of said control signal and output of said inverter.

2. A pull-up circuit having an nMOS transistor, gate-drain connection thereof connected to a first node supplied from a positive terminal of a power supply, a source thereof connected to a pull-up node and a substrate thereof connected to a negative terminal of the power supply said pull-up circuit comprising:

a pMOS transistor, a drain of said pMOS transistor connected to the first node, a source and a substrate of said pMOS transistor connected to the positive terminal, and a gate of said pMOS transistor controlled with a pull-up signal;

an inverter for obtaining inverted logic of said pull-up signal; and a second pMOS transistor, a drain of said second pMOS transistor connected to the first node, a source and a substrate of said second pMOS transistor connected to the positive terminal, and a gate of said second pMOS transistor controlled with output of said inverter.

3. A pull-up circuit having an nMOS transistor, gate-drain connection thereof connected to a first node supplied from a positive terminal of a power supply, a source thereof connected to a pull-up node and a substrate thereof connected to a negative terminal of the power supply said pull-up circuit comprising:

a pMOS transistor, a drain of said pMOS transistor connected to the first node, a source and a substrate of said pMOS transistor connected to the positive terminal, and a gate of said pMOS transistor controlled with a pull-up signal wherein:

said pull-up signal is obtained from the first node by connecting said gate of said pMOS transistor to the first node.

4. A pull-up circuit having an nMOS transistor, gate-drain connection thereof connected to a first node supplied from a positive terminal of a power supply, a source thereof connected to a pull-up node and a substrate thereof connected to a negative terminal of the power supply said pull-up circuit comprising:

a pMOS transistor, a drain of said pMOS transistor connected to the first nodes a source and a substrate of said pMOS transistor connected to the positive terminal, and a gate of said pMOS transistor controlled with a pull-up signal wherein:

said pull-up signal becoming at LOW level when the pull-up circuit is made active.

5. A pull-up circuit having an nMOS transistor, a gate thereof controlled with a pull-up signal, a drain thereof connected to a first node supplied from a positive terminal of a power supply, a source thereof connected to a pull-up node and a substrate thereof connected a negative terminal of the power supply, said pull-up circuit comprising:

an inverter for obtaining inverted logic of the pull-up signal; and a pMOS transistor, a drain of said pMOS transistor connected to the first node, a source and a substrate of said pMOS transistor connected to the positive terminal, and a gate of said pMOS transistor controlled with output of said inverter.

6. A pull-down circuit having a pMOS transistor, gate-drain connection thereof connected to a first node supplied from a negative terminal of a power supply, a source thereof connected to a pull-down node and a substrate thereof connected to a positive terminal of the power supply, said pull-down circuit comprising:

an nMOS transistor, a drain of said nMOS transistor connected to the first node, a source and a substrate of said nMOS transistor connected to the negative terminal, and a gate of said nMOS transistor controlled with a pull-down signal;

an inverter for obtaining inverted logic of a control signal; and a two input NAND gate for outputting said pull-down signal having NAND logic of said control signal and output of said inverter.

7. A pull-down circuit having a pMOS transistor, gate-drain connection thereof connected to a first node supplied from a negative terminal of a power supply, a source thereof connected to a pull-down node and a substrate thereof connected to a positive terminal of the power supply, said pull-down circuit comprising:

an nMOS transistor, a drain of said nMOS transistor connected to the first node, a source and a substrate of said nMOS transistor connected to the negative terminal, and a gate of said nMOS transistor controlled with a pull-down signal;

an inverter for obtaining inverted logic of said pull-down signal; and a second nMOS transistor, a drain of said second nMOS transistor connected to the first node, a source and a substrate of said second nMOS transistor connected to the negative terminal, and a gate of said second nMOS transistor controlled with output of said inverter.

8. A pull-down circuit having a pMOS transistor, gate-drain connection thereof connected to a first node supplied from a negative terminal of a power supply, a source thereof connected to a pull-down node and a substrate thereof connected to a positive terminal of the power supply, said pull-down circuit comprising:

an nMOS transistor, a drain of said nMOS transistor connected to the first node, a source and a substrate of said nMOS transistor connected to the negative terminal, and a gate of said nMOS transistor controlled with a pull-down signal;

wherein:

said pull-down signal is obtained from the first node by connecting said gate of said nMOS transistor to the first node.

9. A pull-down circuit having a pMOS transistor, gate-drain connection thereof connected to a first node supplied from a negative terminal of a power supply, a source thereof connected to a pull-down node and a substrate thereof connected to a positive terminal of the power supply, said pull-down circuit comprising:

a nMOS transistor, a drain of said nMOS transistor connected to the first node, a source and a substrate of said nMOS transistor connected to the negative terminal, and a gate of said nMOS transistor controlled with a pull-down signal, wherein:

said pull-down signal becoming at HIGH level when the pull-down circuit is made active.

10. A pull-down circuit having a pMOS transistor, a gate thereof controlled with a pull-down signal, a drain thereof connected to a first node supplied from a negative terminal of a power supply, a source thereof connected to a pull-down node and a substrate thereof connected a positive terminal of the power supply, said pull-down circuit comprising:

an inverter for obtaining inverted logic of the pull-down signal; and an nMOS transistor, a drain of said nMOS transistor connected to the first node, a source and a substrate of said nMOS transistor connected to the negative terminal, and a gate of said nMOS transistor controlled with output of said inverter.

* * * * *